US012749552B2

(12) United States Patent
Wong et al.

(10) Patent No.: US 12,749,552 B2
(45) **Date of Patent: *Sep. 29, 2026**

(54) SYSTEM AND METHOD FOR CONDUCTING BUILT-IN SELF-TEST OF MEMORY MACRO

(71) Applicant: Taiwan Semiconductor Manufacturing Company, Ltd., Hsinchu (TW)

(72) Inventors: Ted Wong, Hsinchu (CN); Saman Adham, Kanata (CA); Marat Gershoig, Ottawa (CA)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 257 days.

This patent is subject to a terminal disclaimer.

(21) Appl. No.: 18/737,631

(22) Filed: Jun. 7, 2024

(65) Prior Publication Data

US 2024/0321377 A1 Sep. 26, 2024

Related U.S. Application Data

(63) Continuation of application No. 17/470,835, filed on Sep. 9, 2021, now Pat. No. 12,033,710.

(Continued)

(51) Int. Cl.

*G11C 29/00* (2006.01)
*G11C 29/36* (2006.01)
*G11C 29/38* (2006.01)

(52) U.S. Cl.

CPC .............. *G11C 29/38* (2013.01); *G11C 29/36* (2013.01)

(58) Field of Classification Search

None

See application file for complete search history.

(56) References Cited

U.S. PATENT DOCUMENTS 5,991,909 A 11/1999 Rajski et al.
6,260,166 B1 * 7/2001 Bhavsar ......... G01R 31/318541 714/727

(Continued)

FOREIGN PATENT DOCUMENTS

CN 112070219 A 12/2020
TW 200823908 A 6/2008
TW 202029208 A 8/2020

OTHER PUBLICATIONS

Non-Final Office Action on U.S. Appl. No. 17/470,835 Dtd Oct. 5, 2023.

(Continued)

*Primary Examiner* — Mujtaba M Chaudry
(74) *Attorney, Agent, or Firm* — Foley & Lardner LLP

(57) ABSTRACT

Performing a built-in self-test (BIST) on a memory macro includes generating a plurality of input vectors. One input vector is transmitted to the memory macro in each of a plurality of cycles. Each of the plurality of input vectors is associated with a bit width. Generating the input vector includes generating a partial input vector of half the bit width and transmitting the partial input vector to each of a first half of the memory macro and a second half of the memory macro. The method also includes receiving, in each of the plurality of cycles, an output data from the memory macro, such that the output data is generated by the memory macro in response to processing the partial input vector, comparing the output data with a signature value, and determining whether the memory macro is normal or faulty based upon the comparison.

20 Claims, 8 Drawing Sheets

Related U.S. Application Data

(60) Provisional application No. 63/147,989, filed on Feb. 10, 2021.

(56) References Cited

U.S. PATENT DOCUMENTS

| | | | | |
|---|---|---|---|---|
| 7,017,089 | B1 | 3/2006 | Huse | |
| 7,917,820 | B1 | 3/2011 | Pavle et al. | |
| 10,636,481 | B1 | 4/2020 | Chang et al. | |
| 11,428,737 | B1 | 8/2022 | Ziaja et al. | |
| 11,605,422 | B2 | 3/2023 | Lu | |
| 2004/0049529 | A1 | 3/2004 | Awaka et al. | |
| 2007/0204193 | A1 * | 8/2007 | Grise | G01R 31/31724 714/733 |
| 2008/0040640 | A1 | 2/2008 | Okabayashi | |
| 2008/0126901 | A1 | 5/2008 | Cheng et al. | |
| 2008/0244341 | A1 | 10/2008 | Yoshihara | |
| 2010/0211836 | A1 | 8/2010 | Kodama | |
| 2011/0007795 | A1 | 1/2011 | Yeh et al. | |
| 2016/0003900 | A1 * | 1/2016 | Narayanan | G01R 31/318555 714/726 |
| 2016/0109514 | A1 * | 4/2016 | Jindal | G01R 31/318572 714/727 |
| 2017/0103800 | A1 * | 4/2017 | Ware | G11C 11/4093 |
| 2020/0355744 | A1 * | 11/2020 | Narayanan | G01R 31/318552 |
| 2020/0387352 | A1 | 12/2020 | Chawla et al. | |
| 2022/0254429 | A1 | 8/2022 | Wong et al. | |
| 2023/0133360 | A1 | 5/2023 | Naous et al. | |
| 2023/0409452 | A1 | 12/2023 | Tonoyan et al. | |

OTHER PUBLICATIONS

Non-Final Office Action on U.S. Appl. No. 17/470,838 Dtd Mar. 21, 2023.

Notice of Allowance on U.S. Appl. No. 17/470,835 Dtd Mar. 27, 2024.

Notice of Allowance on U.S. Appl. No. 17/470,838 Dtd Aug. 31, 2023.

VLSI Test Principles and Architectures13~Chapter 08 MBIST, Elsevier Publishing, Internet Archive—(Aug. 29, 2017) (Year: 2017).

Office Action issued in connection with Taiwan Appl. No. 111103104 dated Mar. 10, 2025.

* cited by examiner

SYSTEM AND METHOD FOR CONDUCTING BUILT-IN SELF-TEST OF MEMORY MACRO

CROSS-REFERENCE TO RELATED APPLICATION

This application is a Continuation of U.S. patent application Ser. No. 17/470,835, filed Sep. 9, 2021, which claims priority to and the benefit of U.S. Provisional Application No. 63/147,989, filed on Feb. 10, 2021, the entire disclosures of both of which are incorporated by reference herein.

BACKGROUND

The present disclosure relates generally to memory systems, and particularly to performing built-in self-tests in memory systems.

Deep learning algorithms evaluate data sets against predefined importance parameters or weights of several attributes. Such evaluation may be characterized by an additive weighting method that requires a large number of Multiply-and-Accumulate (MAC) operations. In some embodiments, discreet logic circuits may be used to implement the MAC operations. However, such logic circuits require high energy (e.g., power), large circuit implementation, and performance may be limited. Compute in Memory (CIM) is a promising energy efficient solution for deep learning applications. A CIM is configured to perform the MAC operations in addition to storing the data sets and the weights. A CIM is also easy to integrate into a memory system. However, challenges exist in performing Built-In Self-Test (BIST) in CIM.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
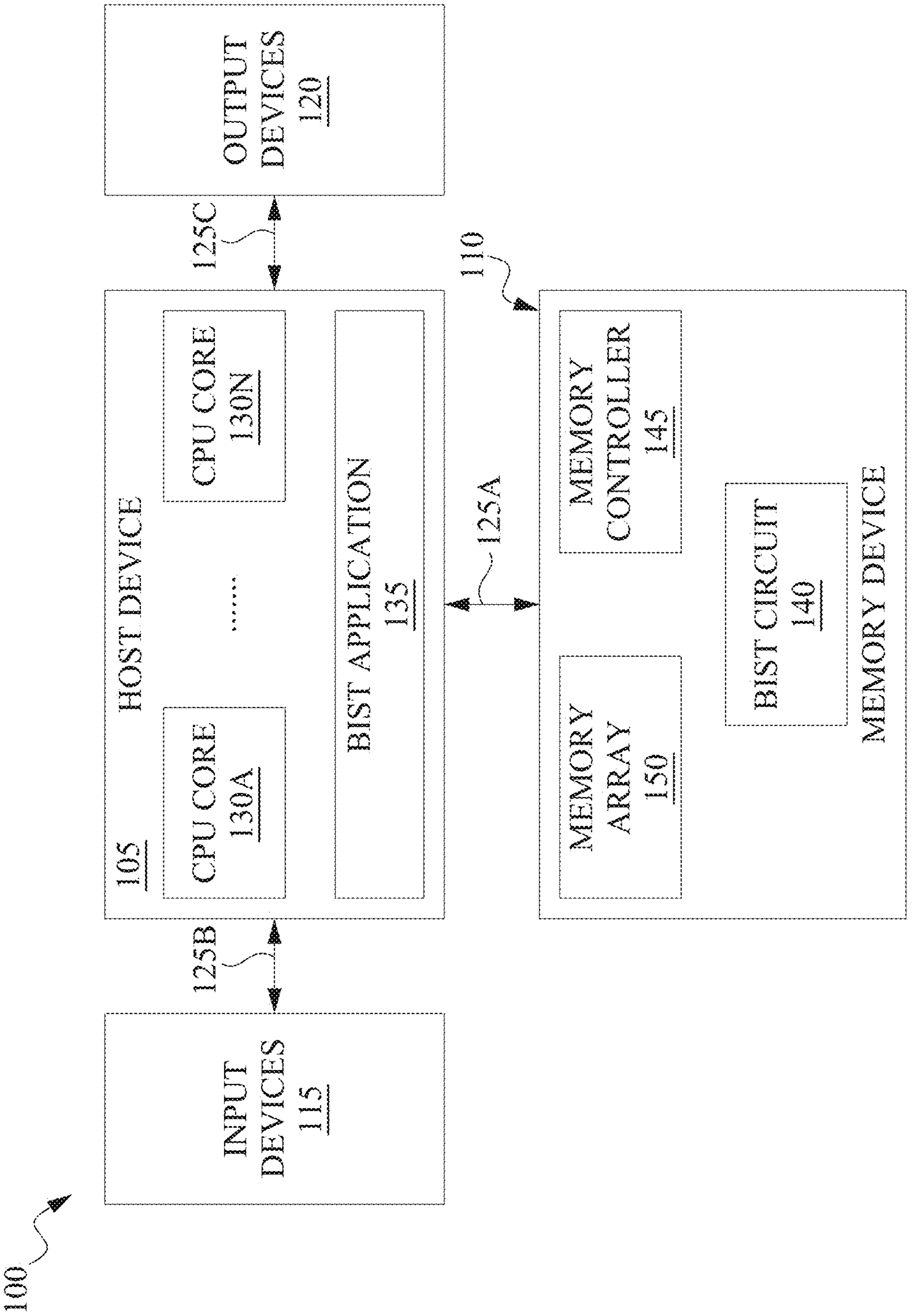
FIG. 1 is an example block diagram of a computing system configured to perform a Built-In Self-Test (BIST) in a Compute in Memory (CIM) macro, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Referring now to FIG. 1, an example block diagram of a computing system 100 is shown, in accordance with some embodiments of the disclosure. The computing system 100 may be used for implementing a Built In Self-Test (BIST) of a memory macro (e.g., a Compute In Memory (CIM) macro). The computing system 100 includes a host device 105 associated with a memory device 110. The host device 105 may be configured to receive input from one or more input devices 115 and provide output to one or more output devices 120. The host device 105 may be configured to communicate with the memory device 110, the input devices 115, and the output devices 120 via appropriate interfaces 125A, 125B, and 125C, respectively. The computing system 100 may be implemented in a variety of computing devices such as computers (e.g., desktop, laptop, servers, data centers, etc.), tablets, personal digital assistants, mobile devices, other handheld or portable devices, or any other computing unit suitable for performing BIST using the host device 105.

The input devices 115 may include any of a variety of input technologies such as a keyboard, stylus, touch screen, mouse, track ball, keypad, microphone, voice recognition, motion recognition, remote controllers, input ports, one or more buttons, dials, joysticks, and any other input peripheral that is associated with the host device 105 and that allows an external source, such as a user, to enter information (e.g., data) into the host device and send instructions to the host device. Similarly, the output devices 120 may include a variety of output technologies such as external memories, printers, speakers, displays, microphones, light emitting diodes, headphones, video devices, and any other output peripherals that are configured to receive information (e.g., data) from the host device 105. The "data" that is either input into the host device 105 and/or output from the host device may include any of a variety of textual data, circuit data, signal data, semiconductor device data, graphical data, configuration data, combinations thereof, or other types of analog and/or digital data that is suitable for processing using the computing system 100.

The host device 105 includes or is associated with one or more processing units/processors, such as Central Processing Unit ("CPU") cores 130A-130N. The CPU cores 130A-130N may be implemented as an Application Specific Integrated Circuit ("ASIC"), Field Programmable Gate Array ("FPGA"), or any other type of processing technology. Each of the CPU cores 130A-130N may be configured to execute instructions for running one or more applications of the host device 105. In some embodiments, the instructions and data needed to run the one or more applications may be stored within the memory device 110. The host device 105 may also be configured to store the results of running the one or more applications within the memory device 110. Thus, the host device 105 may be configured to request the memory device 110 to perform a variety of operations. For example, the host device 105 may request the memory device 110 to read data, write data, update or delete data, perform BIST, and/or perform management or other operations.

One application that the host device 105 may be configured to run may be a BIST application 135. The BIST application 135 may be used in association with a BIST circuit 140 to test one or more memories of the memory device 110. Specifically, the BIST application 135 and the BIST circuit 140 may be used to identify faults or problems in the one or more memories of the memory device 110 that may cause those one or more memories to malfunction. The BIST application 135 and the BIST circuit 140 are discussed in greater detail below. In some embodiments, the instructions needed to execute or run the BIST application 135 and the BIST circuit 140 may be stored within the memory device 110. The BIST application 135 may be executed by one or more of the CPU cores 130A-130N using the instructions associated with the BIST application from the memory device 110. In some embodiments, the BIST application 135 may be used to enter configuration data into the BIST circuit 140, as well as generate various signals to perform BIST on the memory device 110.

Referring still to FIG. 1, the memory device 110 includes a memory controller 145 that is configured to read data from or write data to a memory array 150. In some embodiments, the memory array 150 may include a variety of volatile and/or non-volatile memories. For example, in some embodiments, the memory array 150 may include NAND flash memory cores, NOR flash memory cores, Static Random Access Memory (SRAM) cores, Dynamic Random Access Memory (DRAM) cores, Magnetoresistive Random Access Memory (MRAM) cores, Phase Change Memory (PCM) cores, Resistive Random Access Memory (ReRAM) cores, 3D XPoint memory cores, ferroelectric random-access memory (FeRAM) cores, and other types of memory cores that are suitable for being tested using BIST. Generally speaking, the memory array 150 may include any of a variety of Random Access Memory (RAM), Read-Only Memory (ROM), Programmable ROM (PROM), Erasable PROM (EPROM), Electrically EPROM (EEPROM), hard disk drives, flash drives, memory tapes, optical drives, cloud memory, or any combination of primary and/or secondary memory that is suitable for the functions described herein. In some embodiments, the memory array 150 may be configured as, or be part of, an embedded memory of a system on chip (SOC) integrated circuit device.

The memories within the memory array 150 may be individually and independently controlled by the memory controller 145. In other words, the memory controller 145 may be configured to communicate with each memory within the memory array 150 individually and independently. By communicating with the memory array 150, the memory controller 145 may be configured to read data from or write data to the memory array in response to instructions received from the host device 105. Although shown as being part of the memory device 110, in some embodiments, the memory controller 145 may be part of the host device 105 or part of another component of the computing system 100 and associated with the memory device. The memory controller 145 may be implemented as a logic circuit in either software, hardware, firmware, or combination thereof to perform the functions described herein.

It is to be understood that only some components of the computing system 100 are shown and described in FIG. 1. However, the computing system 100 may include other components such as various batteries and power sources, networking interfaces, routers, switches, external memory systems, controllers, etc. Generally speaking, the computing system 100 may include any of a variety of hardware, software, and/or firmware components that are needed or considered desirable in performing the functions described herein. Similarly, the host device 105, the input devices 115, the output devices 120, and the memory device 110 including the memory controller 145 and the memory array 150 may each include other hardware, software, and/or firmware components that are considered necessary or desirable in performing the functions described herein.

Figure 2:
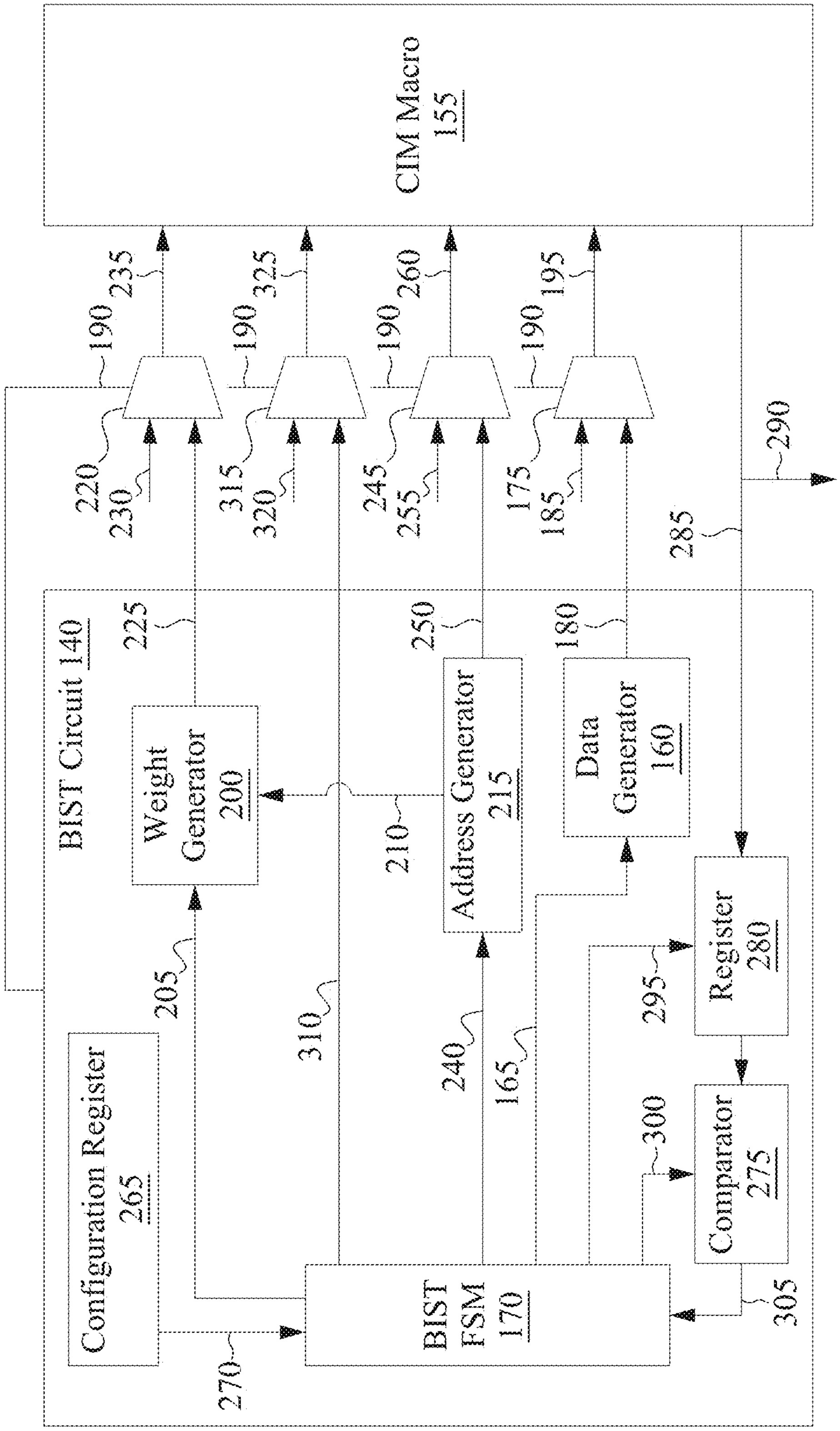
FIG. 2 is an example block diagram of a BIST circuit of the computing system of FIG. 1 for implementing a BIST on the CIM macro, in accordance with some embodiments of the present disclosure.

Turning to FIG. 2, an example block diagram of the BIST circuit 140 is shown, in accordance with some embodiments of the present disclosure. The BIST circuit 140 is shown connected to a CIM macro 155 for performing a BIST on the CIM macro. The CIM macro 155 may be part of the memory array 150. Although not shown, the CIM macro 155 may include a plurality of memory cells for storing data. In some embodiments, the CIM macro 155 may also include related peripheral circuity (e.g., circuitry for reading data from the memory cell, writing data into the memory cells, etc.) The plurality of memory cells may be part of a memory address space of the CIM macro 155. The CIM macro 155 may also be configured to perform computations in addition to storing data. For example, in some embodiments, the CIM macro 155 may be configured to perform Multiply-and-Accumulate (MAC) operations on the data stored therein.

Thus, in some embodiments, the CIM macro 155 may be configured to perform two main functions: (a) a memory function for storing data used in the computations of the MAC operations; and (b) a compute function for performing the MAC operations on the stored data. In some embodiments, the CIM macro 155 may implement the MAC operation of the compute function as follows:

$$\text{Q\_CIM}[j] = \sum_{i=0}^{M} X[i] \cdot W[i, j]$$

In the formula above, M is the total number of attributes (e.g., number of rows in the CIM macro 155), Q_CIM[j] is the accumulated result for the $j^{th}$ cycle, X[i] is the input data, and W[i, j] is the weight being applied to the input data in the $j^{th}$ cycle. In some embodiments, the CIM macro 155 may implement the MAC operations using analog circuits including a transistor level implementation. The analog circuits may be embedded inside the CIM macro 155. In other embodiments, the CIM macro 155 may implement the MAC operations using digital circuits. In some embodiments, the digital circuits may include discreet logic circuits that are outside, and associated with, the CIM macro 155 for performing the MAC operations. In other embodiments, the digital circuits may include logic circuits that are embedded into the CIM macro 155. In yet other embodiments, the CIM macro 155 may implement the MAC operations using a combination of analog and digital circuits.

Further, in some embodiments, the analog circuit implementation of the MAC operation may be tested using analog functional test methods. In other embodiments, the analog circuit implementation of the MAC implementation may be tested by the BIST circuit 140. The discreet logic circuit implementation that is outside, and associated with, the CIM macro 155 may be tested separately from the CIM macro. However, inventors have found no testing methods for CIM macros (e.g., the CIM macro 155) that have the logic circuits for the MAC implementation embedded therein. The BIST circuit 140 may be used to perform BIST on the CIM macro 155 that have the MAC operation functionality embedded therein. A BIST may be used by the CIM macro 155 to test itself with high reliability and accuracy. To perform the BIST on the CIM macro 155, the BIST circuit 140 may be part of the memory device (e.g., the memory device 110) associated with the CIM macro. Thus, in some embodiments, the BIST circuit 140 and the CIM macro 155 may be configured as an SOC.

Although the present disclosure is described in terms of testing the CIM macro 155, it is to be understood that the present disclosure may be used to perform BIST using the BIST circuit 140 on any suitable memory macro or memory device.

The BIST circuit 140 may be configured to generate data for performing BIST on the CIM macro 155. The data may include input data and weight data. The BIST circuit 140 may also be configured to receive output data from the CIM macro 155. The output data may be the result of the MAC operations on the input data and the weight data using the equation discussed above. The BIST circuit 140 may additionally be configured to compare the output data with expected data (e.g., a signature value) to determine if the CIM macro 155 is normal or faulty. The CIM macro 155 may be considered "normal" if the CIM macro performs the MAC operations accurately. The CIM macro 155 may be considered "faulty" if the CIM macro produces inaccurate MAC operation results.

To generate the input data, the BIST circuit 140 may include a data generator 160. The data generator 160 may be configured to generate deterministic, random, or pseudo random input vectors for testing the CIM macro 155. A deterministic input data may include an input vector whose value is known to the user. A random or pseudorandom input data may include an input vector whose value is not known to the user. Each input vector may be of a designated bit width. In some embodiments, the bit width of the input vector may be dependent upon the configuration of the CIM macro 155. For example, in some embodiments, the data generator 160 may be configured to generate input vectors of 64 bits if the CIM macro 155 is configured to handle data of 64 bits. In other embodiments, each input vector may be 32 bits, 72 bits, 128 bits, or of any other bit width depending upon the configuration of the CIM macro 155.

In some embodiments, the data generator 160 may be configured to generate the input vectors using a linear feedback shift register, a series of automated circuits, or any other suitable mechanism. Although not shown, the data generator 160 may be configured as hardware, software, firmware, or a combination thereof. In some embodiments, the data generator 160 may generate the input vectors based upon an input 165 received from a BIST Finite State Machine (FSM) 170. In some embodiments, the BIST FSM 170 may generate the input 165 based upon a configuration value. In some embodiments, the configuration value may include the input vector value that is to be generated by the data generator 160. In some embodiments, the configuration value may indicate an initial input vector value for the data generator 160 to generate an input vector. The configuration value may also include an increment value or shift value to indicate to the data generator 160 how to generate additional input vectors from the initial input vector value. For example, in some embodiments, the configuration value may indicate an increment value of 1. The data generator 160 may then increment the initial input vector value by 1 to obtain a first input vector value, increment the first input vector value by 1 to obtain a second input vector value, and so on. Thus, the data generator 160 may be configured to generate the input vectors in any suitable way.

The data generator 160 may transmit the generated input vector into a multiplexer 175 as input 180. The multiplexer 175 may also receive an input 185. The input 185 may be a functional input vector used during normal operation (e.g., when BIST is not being performed) of the CIM macro 155. Based upon an enable signal 190, the multiplexer 175 may select either the input 180 or the input 185 as output 195. The output 195 may be input into the CIM macro 155 for a MAC operation. In some embodiments, the output 195 may be stored into the CIM macro 155. In other embodiments, the output 195 may be stored in a register associated with the CIM macro 155. The enable signal 190 may be generated by the BIST circuit 140 (e.g., by the BIST FSM 170). If the enable signal 190 indicates a BIST mode, the multiplexer 175 selects the input 180 as the output 195 and if the enable signal indicates a functional mode (e.g., normal operation), the multiplexer selects the input 185 as the output. Although the multiplexer 175 is shown separate from the CIM macro 155, in some embodiments, the multiplexer may be part of the CIM macro. For example, in some embodiments, the multiplexer 175 may be part of the peripheral circuitry of the CIM macro 155. In other embodiments, the multiplexer 175 may be part of the BIST circuit 140 or any other component associated with the BIST circuit and the CIM macro 155.

The BIST circuit 140 may also include a weight generator 200. Although not shown, the weight generator 200 may be configured as hardware, software, firmware, or a combination thereof. The weight generator 200 may generate one or more weights to be applied to the input vector generated by the data generator 160. In some embodiments, the weight generator 200 may generate the weights based upon an input 205 received from the BIST FSM 170. The weight generator 200 may also receive an input 210 from an address generator 215 to identify the memory addresses of the CIM macro 155 for which the weights are to be generated. Weight generation is discussed in greater detail below. The weights generated by the weight generator 200 are input into a multiplexer 220 as input 225.

The multiplexer 220 may also receive a functional weight input 230 (e.g., used during normal operation of the CIM macro 155). Based upon the enable signal 190, the multiplexer 220 may select either the input 225 or the functional weight input 230 as output 235, which is input into the CIM macro 155. The output 235 may be stored within the CIM macro 155. If the enable signal 190 indicates a BIST mode, the multiplexer 220 selects the input 225 as the output 235 and if the enable signal indicates a functional mode (e.g., normal operation), the multiplexer selects the input 230 as the output. Similar to the multiplexer 175, the multiplexer 220 may be part of the CIM macro 155, the BIST circuit 140, or any other component associated with the BIST circuit or the CIM macro.

The address generator 215 may be configured to generate memory addresses where the weights generated by the weight generator 200 are to be stored in the CIM macro 155. The address generator 215 may generate the memory addresses in response to an input 240 received from the BIST FSM 170. The input 240 may indicate the addresses or address range of the CIM macro 155 based on which the address generator 215 generates the addresses. In some embodiments, the address generator 215 may be configured to generate write addresses for storing the input vectors, write addresses for storing the weights, read addresses for reading the stored input vectors and weights for performing the MAC operations, and/or write addresses for storing the output data before transmission back to the BIST circuit 140. In some embodiments, the address generator 215 may be configured as a linear feedback shift register or use other types of logic circuits or mechanisms to generate the addresses. The address generator 215 may input the generated memory addresses into a multiplexer 245 as input 250. The multiplexer 245 may also receive a functional memory address input 255 (e.g., used during normal operation of the CIM macro 155). Based upon the enable signal 190, the multiplexer 245 may select either the input 250 or the input 255 as output 260, which is input into the CIM macro 155. If the enable signal 190 indicates a BIST mode, the multiplexer 245 selects the input 250 as the output 260 and if the enable signal indicates a functional mode (e.g., normal operation), the multiplexer selects the input 255 as the output. In some embodiments, the multiplexer 245 may be part of the CIM macro 155, the BIST circuit 140, or any other component associated with the BIST circuit and/or the CIM macro.

The BIST circuit 140 may also include a configuration register 265. The configuration register 265 may be used to receive configuration values from a user to configure the BIST. For example, in some embodiments, the configuration register 265 may receive an input from a user (e.g., via the BIST application 135) indicating which BIST methodology to apply. For example, in some embodiments, the BIST methodology may be a broadside input pattern BIST methodology, a multiple background weights BIST methodology, a weight as memory background BIST methodology, or a fault free CIM result BIST methodology. Each of these BIST methodologies is explained in greater detail below. The BIST methodology may be indicative of the input data to be used, the weights to be used, the address range to be used, the number of cycles in the BIST, the signature value in each cycle, and any other details that may be needed or desired in performing the BIST for that BIST methodology. The configuration values may be input from the configuration register 265 into the BIST FSM 170, as indicated by arrow 270. Based upon the configuration values, the BIST FSM 170 may generate one or more inputs (e.g., the input 165, 205, 240, etc.) for controlling the operation of the other components (e.g., data generator 160, the weight generator 200, the address generator 215, etc.) of the BIST circuit 140.

The BIST FSM 170 may also control the operation of a comparator 275 and a register 280. Upon receiving the various BIST inputs (e.g., the input vector and the weights), the CIM macro 155 may perform the compute function using the equation discussed above. The result of that computation may be output from the CIM macro 155 as output 285. The output 285 may be input into the register 280, as well as output for user review, as indicated by arrow 290. The output 285 may be stored within the register 280 based upon a control signal 295 received from the BIST FSM 170. The output 285 may also be input from the register 280 into the comparator 275. The comparator 275 may compare the output 285 with a signature value received from the BIST FSM 170 via a signature signal 300.

The signature value may indicate the expected value of the computation performed by the CIM macro 155 for the input vector and weights input into the CIM macro in the BIST mode. An output 305 of the comparator 275 may indicate whether the output 285 matches the signature value. In some embodiments, the output 305 may be input into the BIST FSM 170, which in some embodiments, may send that output to the configuration register 265. The user may read the output 305 from the configuration register 265 to determine if the CIM macro 155 is normal or faulty. In some embodiments, the BIST FSM 170 may also store the output 305 into the register 280.

In some embodiments, the BIST may be performed over a plurality of cycles. Each of the plurality of cycles may include applying an input vector and weights into the CIM macro 155 from the BIST circuit 140, the CIM macro performing the MAC operations on the input vector and the weights and sending the output 285 back to the BIST circuit 140. In some embodiments, the output 305 of the comparison of the output 285 with the signature value may be stored in the register 280, and the determination of whether the CIM macro 155 is faulty or normal may be made at the end of the plurality of cycles based upon an analysis of the output 305 of each of the plurality of cycles. In some embodiments, the number of the plurality of cycles that are used may be a large number to provide greater fault coverage and fault diagnosis of the CIM macro 155. For example, in some embodiments, the number of the plurality of cycles may be greater than the number of cycles during an actual functioning of the CIM macro 155. Further, in some embodiments, the same BIST methodology may be implemented in each of the plurality of cycles. In other embodiments, a combination of methodologies may be used in the plurality of cycles.

The BIST FSM 170, as indicated above, may be configured to control the operation of the BIST circuit 140. Based upon the configuration values received from the configuration register 265, the BIST FSM 170 may generate the input 165 to the data generator 160 to generate one or more input vectors. Similarly, based upon the configuration values, the BIST FSM 170 may generate the input 205 to the weight generator 200 to generate the weights, as well as the input 240 to the address generator 215 to generate the addresses. The BIST FSM 170 may also generate a control signal 310 that may serve as a write enable signal to allow the data being sent by the BIST circuit 140 to be written into the CIM macro 155. Specifically, the control signal 310 may be input into a multiplexer 315.

The multiplexer 315 may also receive an input 320. Based upon the enable signal 190, the multiplexer 315 may select either the control signal 310 or the input 320 as output 325, which is input into the CIM macro 155. The input 320 may be a control signal (e.g., write enable) used for storing data within the CIM macro 155 during normal operation. Thus, the input 320 may be considered a functional control signal. If the enable signal 190 indicates a BIST mode, the multiplexer 315 selects the control signal 310 as the output 325 and writes the data (e.g., input vector and weights) being sent by the BIST circuit 140 to the CIM macro 155. If the enable signal 190 indicates a functional mode (e.g., normal operation), the multiplexer 315 selects the input 320 as the output 325 and writes the functional data (e.g., the functional input vector and functional weights) into the CIM macro 155. In some embodiments, the multiplexer 315 may be part of the CIM macro 155, the BIST circuit 140, or any other component associated with the BIST circuit and/or the CIM macro.

It is to be understood that only some components of the BIST circuit 140 are shown and described herein. Nevertheless, the BIST circuit 140 may include other or additional components that may be needed or considered desirable to have in performing the functions described herein. Further, the data generator 160, the BIST FSM 170, the weight generator 200, the address generator 215, the configuration register 265, the comparator 275, and the register 280 may be configured as software, hardware, firmware, or combination thereof, and may be sized as needed. Similarly, the multiplexers 175, 245, 315, and 220 may be configured in any suitable way.

Figure 3:
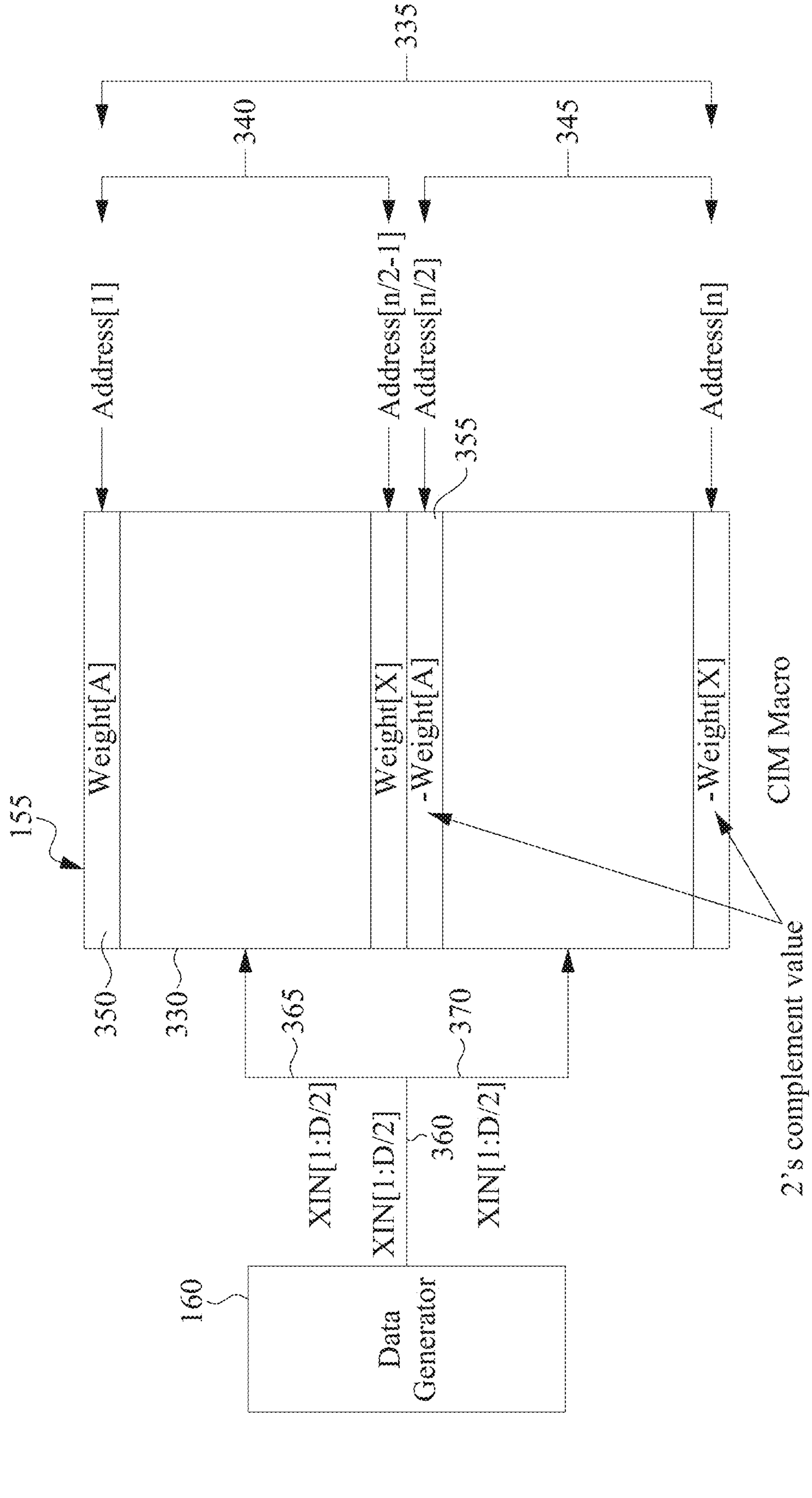
FIG. 3 is an example block diagram showing additional details of the BIST implementation by the BIST circuit of FIG. 2, in accordance with some embodiments of the present disclosure.

Turning now to FIG. 3, an example block diagram showing additional details of BIST are shown, in accordance with some embodiments of the present disclosure. Specifically, FIG. 3 shows the CIM macro 155 and the data generator 160 of the BIST circuit 140. The CIM macro 155 has a memory address range 335 (e.g., memory address [1:n]). In some embodiments, the memory address range 335 may be divided into a first half 340 (e.g., including memory addresses [1, n/2-1]) and a second half 345 (e.g., including memory addresses ([n/2, n]). In some embodiments, each of the first half 340 and the second half 345 of the memory address range 335 may be equal. In other words, in some embodiments, each of the first half 340 and the second half 345 may have an equal number of memory addresses. Further, each or at least some of the memory addresses in the first half may have a corresponding memory address in the second half. For example, memory "Address [1]" may correspond to memory "Address [n/2]" since the memory "Address [n/2]" may be the first memory address of the second half 345. Each memory address in the first half 340 and the second half 345 may be configured to store one weight value and/or one input vector in some embodiments.

In some embodiments, the first half 340 of the memory address range 335 may be configured to store a first set of weight values (e.g., weight values [A, X]). Further, in some embodiments, the second half 345 of the memory address range 335 may be configured to store a 2's complement of the weight values stored in the first half 340. For example, a memory address 350 of the first half 340 may correspond to a first memory address of the first half and may store a weight value, A. A memory address 355 of the second half 345 may correspond to a first memory address of the second half and may store a 2's complement of the weight value, A, that is stored in the memory address 350 of the first half 340. 2's complement may be used for representing signed binary values. Thus, in some embodiments, the weight value stored at the memory address 355 may represent a negative notation (e.g., −A) of the weight value (e.g., +A) stored at the memory address 350.

In some embodiments, the weight generator 200 may be configured to generate the 2's complement values. For example, in some embodiments, for each weight value that the weight generator 200 generates for storing in a memory address of the first half 340, the weight generator may generate a 2's complement of that weight value for storing in a corresponding memory address of the second half 345. In some embodiments, the weight generator 200 may compute the 2's complement value of a weight value by inverting the binary digits of the weight value to obtain an inverted weight value (e.g., converting 0's to 1's and 1's to 0's) and adding 1 to the inverted weight value. In other embodiments, the weight generator 200 may generate the 2's complement in other ways. In some embodiments, another component of the BIST circuit 140 may be designated to compute the 2's complement value of a weight value upon receiving the weight value from the weight generator 200. The generation of the weight values that are stored in the memory addresses of the first half 340 is discussed in greater detail below.

Although the present disclosure describes storing the actual or positive weight values in the first half 340 of the memory address range 335 and 2's complement or negative weight values in the second half 345 of the memory address range, in some embodiments, the first half may be configured to store the 2's complement or negative weight values and the second half may be configured to store the actual or positive weight values.

Further, in some embodiments and as noted above, the input vectors that are applied to the weight values stored in the memory address range 335 may be of a designated bit width, D. In some embodiments, for an input vector of a bit width, D, the data generator 160 may generate an input vector of size D/2 (e.g., XIN[1:D/2]), as shown by arrow 360. The XIN[1:D/2] bits of the input vector may be applied to the weight values stored in the first half 340 of the memory address range, as shown by arrow 365, and the same XIN[1:D/2] bits of the input vector may be applied to the 2's complement of the weight values stored in the second half 345, as shown by arrow 370.

Thus, in some embodiments, the same input data may be applied to each of the first half 340 and the second half 345 of the memory address range 335. For example, in some embodiments, for a 64-bit input vector, the data generator 160 may generate a 32-bit input vector.

The data generator 160 may then store the same 32-bit input vector in each of the first half 340 and the second half 345. Thus, the actual input vector may be a combination of the 32 bits stored in the first half 340 and the 32 bits stored in the second half 345 for a total bit width of 64 bits for the input vector. In other words, the left most 32 bits (e.g., bits 0-31) of the input vector may be same as the rightmost 32 bits (e.g., bits 32-63) of the input vector. The 32 bits of the input vector may be applied to the weight value stored in each memory address of the memory address range 335. Thus, for a given bit width, the data generator 160 may generate an input vector of half that bit width and apply the input vector corresponding to the half bit width to each memory address of the first half 340 and the second half 345.

In other embodiments, one half of the input vector may be a 2's complement value of the other half. For example, in some embodiments, for a 64-bit input vector, the data generator 160 may generate a 32-bit input vector and compute a 2's complement of that 32-bit input vector. The actual input vector may then be a combination of the generated 32-bit input vector and the 2's complement of the 32-bit input vector. In some embodiments, the data generator 160 may write the 32-bit input vector in either the first half 340 or the second half 345 of the memory address range 335, and the 2's complement of the 32-bit input vector in the other one of the first half and the second half.

Figure 4:
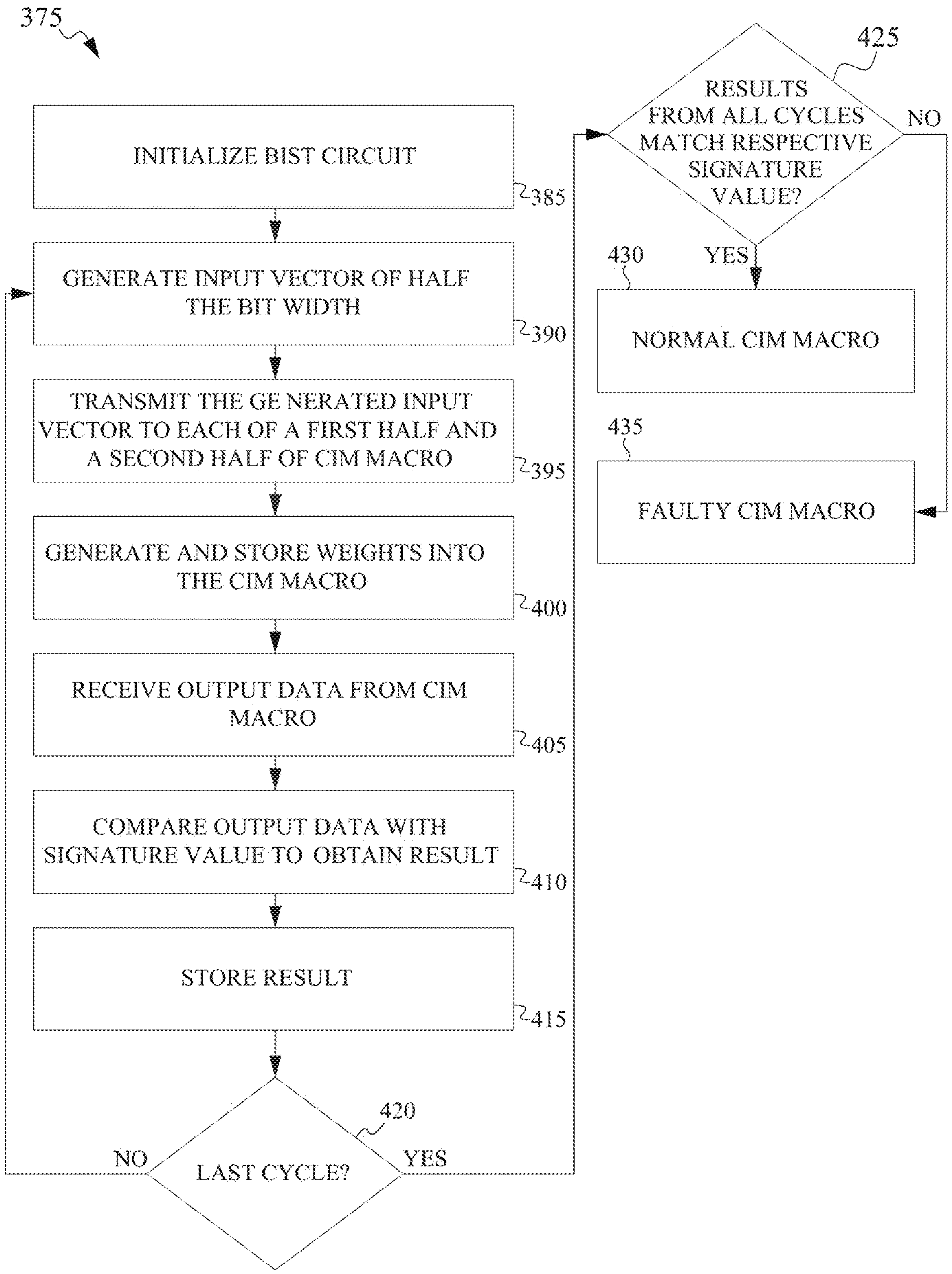
FIG. 4 is an example flowchart outlining operations of a process performed by the BIST circuit of FIG. 2 for implementing a broadside input pattern BIST methodology on the CIM macro, in accordance with some embodiments of the present disclosure.

Turning now to FIG. 4, an example flowchart outlining operations of a process 375 for implementing a broadside input pattern BIST methodology is shown, in accordance with some embodiments of the present disclosure. The process 375 may be implemented by the BIST circuit 140. To implement the broadside input pattern BIST methodology, at operation 385, the BIST circuit 140 is initialized or configured. Specifically, at the operation 385, a user may input configuration values into the configuration register 265. The configuration values may include the data pattern to be generated for each cycle, a number of cycles, an expected signature value for each cycle, an initial weight register value, memory addresses, and any other input that may be needed or considered desirable to have in implementing the process 375. In each cycle, the data generator 160 may generate one input vector. Thus, in some embodiments, each cycle of the plurality of cycles may be based on a different input vector.

The configuration values input into the configuration register 265 may be transmitted to the BIST FSM 170, which may then generate the inputs 165, 240, 205, the control signal 310, the control signal 295, and the control signal 300, as discussed above. Upon receiving the input 165, the data generator 160 generates an input vector at operation 390 for the current cycle. The input 165 may indicate the data pattern based on which the data generator 160 is to generate the input vector. Specifically, the data generator 160 may generate a partial input vector of half the bit width desired. For example, for a 64-bit input vector that is desired, the data generator 160 generates a 32-bit input vector. At operation 395, the data generator 160 transmits the partial input vector into a first half (e.g., the first half 340) of the CIM macro 155, as well as into a second half (e.g., the second half 345) of the CIM macro as discussed above. In some embodiments, the transmission of the partial input vector in the first half and the second half may occur in parallel. In other embodiments, the transmission of the partial input vector in the first half and the second half may occur in series.

Further, in the embodiments in which a 2's complement value is used for the input vector, at the operation 395, upon generating the partial input vector, the data generator 160 may compute a 2's complement of the partial input vector. The data generator 160 may transmit the partial input vector into the first half (e.g., the first half 340) of the CIM macro 155 and the 2's complement of the partial input vector into the second half (e.g., the second half 345) of the CIM macro.

In some embodiments, to transmit the input vector into the CIM macro 155, the BIST FSM 170 may generate the enable signal 190 that allows the multiplexer 175 to select the input 180 from the data generator 160 of the BIST circuit 140. The BIST FSM 170 may also generate the control signal 310 that allows the multiplexer 315 to select the control signal from the BIST circuit and facilitate the transmission and/or writing of the input vector into the CIM macro 155. In some embodiments, the input vector may be stored in a register associated with the CIM macro 155.

At operation 400, weights are generated and stored within the CIM macro 155. Although the generation of the input vector is described as occurring before the generation of the weights, in some embodiments, the generation of the weights may occur before the generation of the input vector, or both operations may occur in parallel. In some embodiments, the same weight values may be used in each of the plurality of cycles. In other embodiments, different weight values may be used in at least some of the plurality of cycles. In some embodiments, the weight values may be stored in the CIM macro 155 at the addresses provided by the address generator 215. In some embodiments, weight values may be stored in the first half (e.g., the first half 340) of the CIM macro 155 and 2's complement of the weight values stored in the first half may be stored in the second portion (e.g., the second half 345) of the CIM macro.

The weight values may be generated by the weight generator 200. In some embodiments, the number of weight values that are generated may correspond to the number of rows (e.g., number of memory addresses) in the first half 340 or the second half 345 of the memory address range 335. For example, if the first half 340 and the second half 345 each have 32 memory addresses (e.g., 32 rows), the weight generator 200 may generate 32 weight values to be stored in either the first half or the second half. The weight generator 200 may also compute a 2's complement of each of those 32 values to obtain 32 more weight values to be stored in the other one of the first half 340 or the second half 345. To write the weight values into the CIM macro 155, the enable signal 190 allows the multiplexer 220 to select the weight values from the BIST circuit 140 as the output 235, which may be written to the addresses selected by the address generator 215.

Upon sending the input vector and the weight values into the CIM macro 155, at operation 405, the BIST circuit 140 receives the output data from the CIM macro. Specifically, the CIM macro performs a MAC operation on the input vector of the operation 395 and the weight values of the operation 400 using the equation described above. Thus, each cycle in the plurality of cycles may generate one output data. The output data (e.g., the output 285) may be received and stored into the register 280 and also provided to the comparator 275.

At operation 410, the comparator 275 compares the output data from the operation 405 with the signature value received as a configuration value at the operation 385. The comparison may indicate whether the output data from the operation 405 matches the signature value or does not match the signature value. In some embodiments, the result (e.g., match or no match) of the comparison is sent to the BIST FSM 170 at operation 415, which may send the result to the register 280 for storing. At operation 420, the BIST FSM 170 determines if additional cycles are remaining in the BIST. If more cycles are remaining, the process 375 loops back to the operation 385 where a new input vector is generated and stored in the CIM macro. In some embodiments, new weights may also be generated at the operation 400. In other embodiments, the same weights may be used. The operations 385-415 may be repeated for each cycle.

Upon completing all the plurality of cycles, at operation 425, the BIST FSM 170 analyzes all the stored results from the operation 415. If the results in all of the cycles indicate a match with their respective signature values, the process 375 proceeds to operation 430 where the BIST FSM 170 declares the CIM macro 155 to be normal. On the other hand, if at least one of the results do not match their respective signature value, the process 375 proceeds to operation 435 where the BIST FSM 170 declares the CIM macro 155 to be faulty. Thus, in some embodiments, the CIM macro 155 is considered normal only upon the output data from each of the plurality of cycles matching the signature value of that cycle. In some embodiments, instead of passing the CIM macro 155 only upon the output data from each cycle of the plurality of cycles matching their respective signature values, in some embodiments, the CIM macro may be considered normal if the number of cycles in which there is a match is above a predefined threshold. For example, in some embodiments, the BIST FSM 170 may consider the CIM macro 155 to be normal of if X % of the cycles have output data that match their respective signature values. Thus, the benchmark for finding the CIM macro 155 to be normal or faulty may be predefined and provided as a configuration value and stored within the BIST FSM 170. In some embodiments, the determination of whether the CIM macro 155 is normal or faulty may be written into the configuration register 265 from which a user may read and determine the status of the CIM macro.

Figure 5:
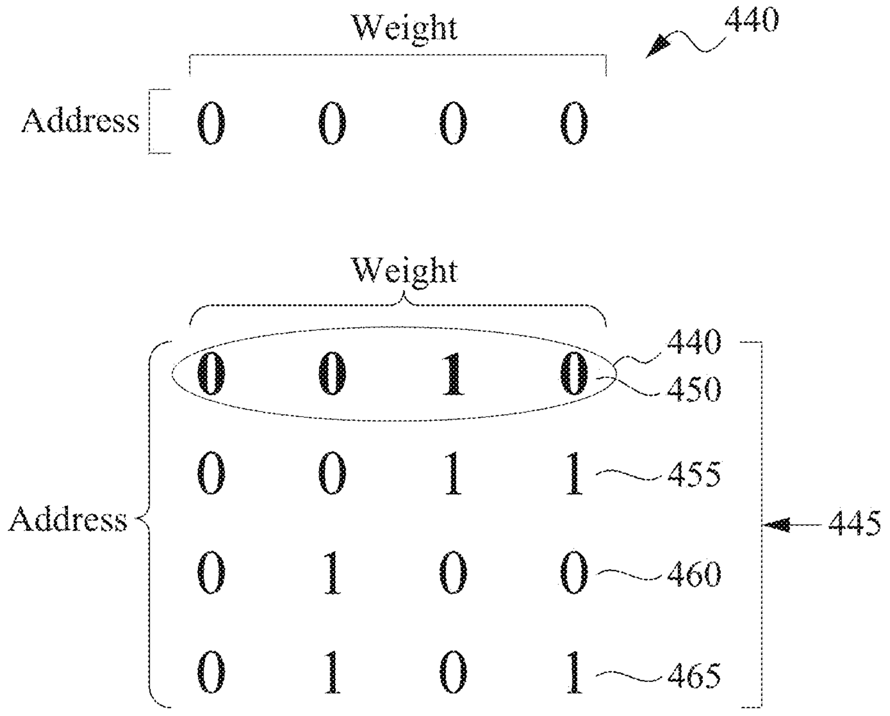
FIG. 5 is an example block diagram showing an initial weight register and an active weight register used by the BIST circuit of FIG. 2 for generating weights for implementing the BIST on the CIM macro, in accordance with some embodiments of the present disclosure.

Referring now to FIG. 5, an example diagram explaining weight value generation is shown, in accordance with some embodiments of the present disclosure. The weight values are generated by the weight generator 200. As discussed above, in some embodiments, the memory address range 335 may be divided into two halves. Weight values may be written to the first half 340 and 2's complement of the weight values may be written to the second half 345. The weight generator 200 may generate the weight values for the first half 340 and the second half 345. The weight generator 200 may generate the weight values for the first half 340 based on an initial weight register value, an increment value, and the write address. In some embodiments, the initial weight register value, the increment value, and the write addresses may be provided as a configuration value within the configuration register 265. From the configuration register 265, these configuration values may be transmitted to the BIST FSM 170, which may then generate the inputs 205 and 240. Based on the input 240, the address generator 215 may generate the write addresses and send the write addresses to the weight generator 200 as the input 210. The weight generator 200, upon receiving the input 205 and the input 210 from the address generator 215 may generate weight values for the first half 340 and the second half 345 of the CIM macro 155.

In some embodiments, the weight generator 200 may use two registers to generate the weight values for the first half 340 of the memory address space: an initial weight register 440 and an active weight register 445. In some embodiments, the weight generator 200 may receive the initial weight register value via the input 205. The weight generator 200 may write the initial weight register value in the initial weight register 440 and designate that value for an initial write address as determined by the input 210. For example, and as shown in FIG. 5, the initial weight register 440 has been initialized with the value 0010. It is to be understood that the values in FIG. 5 are only an example and not intended to be limiting in any way.

Based on the value in the initial weight register 440, the weight generator 200 may populate the active weight register 445 as follows:

$$awr_0 \leftarrow iwr$$

$$awr_{i+1} \leftarrow F(awr_i + C,\ A)$$

In the function above, $awr_i$ indicates a row of the active weight register 445, C indicates the increment value, and A indicates the write address where the $awr_{i+1}$ value is to be written.

Thus, the active weight register 445 may be initialized with the value of the initial active register 440 to be written in the memory address indicated in the initial write address. For example, a first row 450 of the active weight register 445 is shown as being initialized with the initial weight register value to be written in the initial write address. Based on the value in the first row 450, the weight value for a second row 455 of the active weight register 445 is determined. For example, if the increment value is 1, the weight value in the first row 450 is incremented by 1 to obtain the value of 0011 shown in the second row 455 and designated to be written in the next memory address of the first half 340. Similarly, the weight value in a third row 460 of the active weight register 445 may be determined by incrementing the weight value in the second row 455 by 1, and the weight value in a fourth row 465 of the active weight register may be determined by incrementing the weight value in the third row by 1.

Although the active weight register 445 is shown as having only four rows, with each row corresponding to a particular memory address, the number of rows in the active weight register may be dependent upon the number of memory addresses for which the weight values are being generated (e.g., number of memory addresses in the first half 340). Further, although the increment value used in the example above is 1, other increment values may be used in other embodiments.

The weight values in the active weight register 445 may be written into the CIM macro 155. For example, the weight value in the first row 450 of the active weight register 445 may be written into a first memory address (e.g., the memory address 350) of the CIM macro 155. Similarly, the weight value in the second row 455 may be written into a second memory address of the first half 340 for which that weight value is designated, and so on.

Additionally, in some embodiments, upon generating the weight values for the first half 340, the weight generator may generate the 2's complement of those weight values. For example, in FIG. 5, the weight generator 200 may generate a 2's complement of each of the weight values in the first row 450, the second row 455, the third row 460, and the fourth row 465. In some embodiments, the 2's complement values may also be stored within the active weight register 445. In other embodiments, the 2's complement values may be stored in a separate register. The weight generator may write the 2's complement values in the second half 345 of the CIM macro 155.

Figure 6:
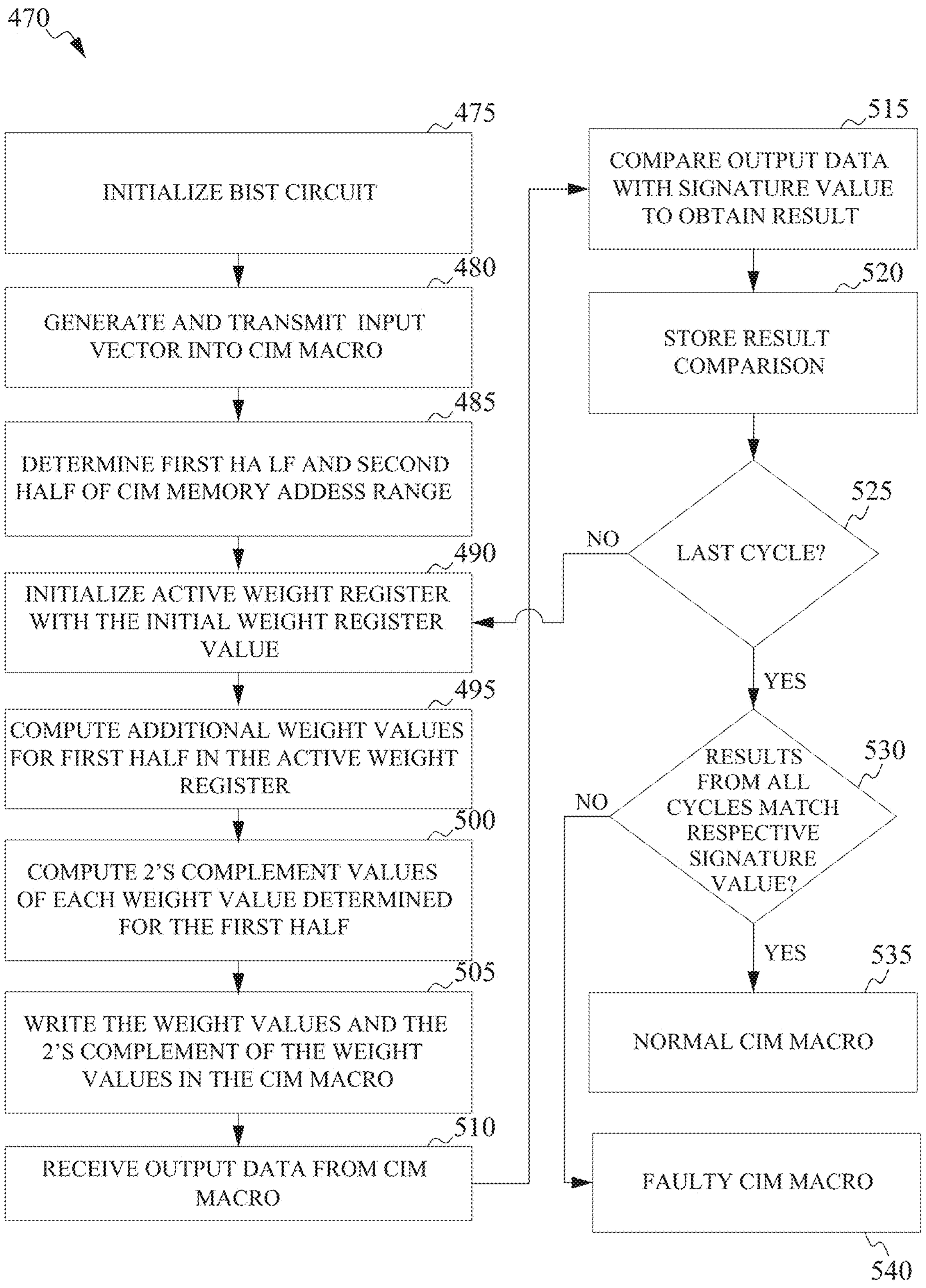
FIG. 6 is an example flowchart outlining operations of a process performed by the BIST circuit of FIG. 2 for implementing a weight as memory background BIST methodology on the CIM macro, in accordance with some embodiments of the present disclosure.

Turning to FIG. 6, an example flowchart outlining operations of a process 470 is shown, in accordance with some embodiments of the present disclosure. The process 470 may be used to implement a weight as memory background BIST methodology for performing BIST on the CIM macro 155. At operation 475, the BIST circuit 140 is initialized by writing configuration values in the configuration register 265. The configuration values may include the data pattern to be generated for each cycle, a number of cycles, an expected signature value for each cycle, an initial weight register value for each cycle, memory addresses, and any other input that may be needed or considered desirable to have in implementing the process 470. At operation 480, the data generator 160 generates an input vector and stores that input vector in the CIM macro 155, as discussed above with respect to FIGS. 3 and 4. In some embodiments, the same input vector may be used for each cycle and the weight values may be varied in each cycle. In other embodiments, both the input vector and the weight values may be varied in at least some cycles.

At operation 485, the BIST FSM 170 or the address generator 215 determines the number of addresses in the first half 340 of the memory address range 335 and the second half 345 of the memory address range. In some embodiments, the number of memory addresses in the first half 340 and the second half 345 may be fixed (e.g., dependent upon the total number of memory addresses in the memory address range 335). In some embodiments, it may be desired to test only a portion of the memory address range 335. In such cases, the BIST FSM 170 or the address generator 215 may determine the number of memory addresses in the first half 340 and the second half 345 by dividing the total number of memory addresses from the configuration value by half. The address generator 215 may generate addresses for each of the first half 340 of the memory address range 335 and the second half 345 of the memory address range. The address generator 215 may send the generated addresses to both the weight generator 200 and the CIM macro 155. At operation 490, the weight generator 200 initializes the active weight register 445 with the value of the initial weight register 440. In some embodiments, the weight generator 200 may write each value in the active weight register 445 into the CIM macro 155 as the weight value is generated. In other embodiments, the weight generator 200 may generate all the weight values before writing them all together into the CIM macro 155. At operation 495, the weight generator 200 computes the remaining weight values for the first half 340, as discussed above in FIG. 5. At operation 500, the weight generator 200 computes the 2's complement of the weight values determined at the operations 490 and 495. At operation 505, the computed weight values and the 2's complement of the weight values are written into the designated memory addresses of the CIM macro 155.

Specifically, the weight values are sent to the multiplexer 220, the BIST FSM 170 generates the enable signal 190 and the functional weight input 230 to allow the multiplexer 220 to select the input 225 for writing the weight values and the 2's complement of the weight values into the CIM macro 155. Upon writing the input vector and the weight values into the CIM macro 155, at operation 510, the output data is received from the CIM macro. The operation 510 is similar to operation 405, and therefore, not described again. Similarly, operations 515-540 are similar to operations 410-435, and therefore, not described again. For example, at the operation 515, the comparator 275 compares the output data received at the operation 510 with the signature value for that cycle and the result (e.g., match, no match) of the comparison is stored in the register 280 at the operation 520. If, at the operation 525, the BIST FSM 170 determines that there are additional cycles of BIST to be performed, the process 470 loops back to the operation 490 if the same input vector is to be used or to the operation 480 if a different input vector is to be used.

Upon completing all cycles, the BIST FSM 170 determines if all (or a threshold number of) cycles have results that match with their respective signature values at the operation 530 and determines whether the CIM macro 155 is normal at the operation 535 or faulty at the operation 540, as discussed above.

Figure 7:
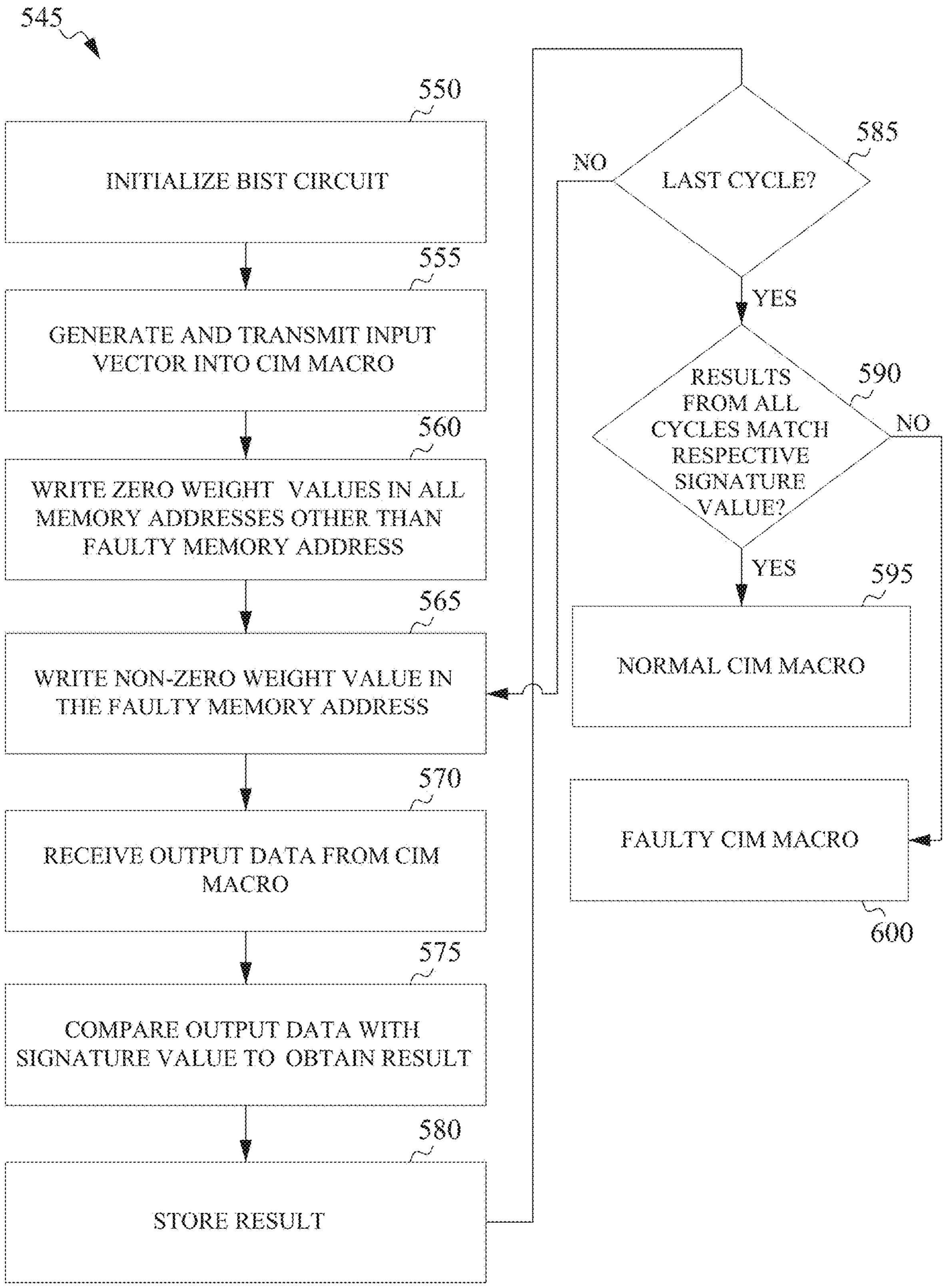
FIG. 7 is an example flowchart outlining operations of a process performed by the BIST circuit of FIG. 2 for implementing a multiple background weights BIST methodology on the CIM macro, in accordance with some embodiments of the present disclosure.

Referring now to FIG. 7, an example flowchart outlining operations of a process 545 is shown, in accordance with some embodiments of the present disclosure. The process 545 may be used to implement a multiple background weights BIST methodology by the BIST circuit 140. The multiple background weights BIST methodology may be particularly beneficial to use when faults in specific bits of a particular memory address are desired to be found. For example, in some embodiments, the processes of FIGS. 4 and 6 may be used to identify a faulty memory address. The process 545 may then be used to identify the exact bit of the faulty memory address that is faulty. Thus, the process 545 may afford better fault diagnosis. For example, in some embodiments, upon determining a faulty memory address, the BIST circuit 140 may write zero value weights to all memory addresses except for the faulty memory address. The weight value written into the faulty memory address may be changed in each cycle (e.g., by one bit) until the faulty bit (or bits) is (are) identified.

Thus, at the operation 550 the BIST circuit 140 is initialized by writing configuration values in the configuration register 265. For example, in some embodiments, the configuration values may include the faulty memory address, weight values (or at least the initial weight register value) for the faulty memory address, number of cycles, signature value for each cycle, data pattern, and any other information that may be needed or considered desirable. The number of cycles when trying to identify one or more faulty bits may correspond to the number of bits in the faulty memory address. At operation 555, the data generator 160 generates an input vector and stores that input vector into the CIM macro 155, as discussed above. In some embodiments, the same input vector may be used in each cycle. In other embodiments, at least some of the cycles may use a different input vector. At operation 560, the weight generator 200 writes weight values of zeroes to all memory address locations other than the faulty memory address location.

At operation 565, the weight generator 200 writes a non-zero weight value in the faulty memory address. The weight value may be supplied as a configuration value or may be generated by the weight generator as discussed above in FIG. 5. At operation 570, the BIST circuit 140 receives the output data of the MAC operation from the CIM macro 155. The operation 570 is similar to the operation 405. Similarly, operations 575 and 580 are similar to the operations 410 and 415, respectively, in which the output data is compared with the signature value of the respective cycle, and the result (e.g., match or no match) of the comparison is stored within the register 280.

At operation 585, the BIST FSM 170 determines if all the bits of the faulty memory location have been tested. If not, the process 545 loops back to the operation 565 where a different weight value is written to the faulty memory address. For example, in some embodiments, one bit of the weight value from the previous cycle may be varied to generate the weight value for the next cycle. If at the operation 585, the BIST FSM 170 determines that all cycles are completed, the process 545 proceeds to operation 590.

Upon completing all cycles, the BIST FSM 170 determines if all (or a threshold number of) cycles have results that match with their respective signature values at the operation 590 and determines whether the faulty memory address passes or fails the BIST. If all the bits of the faulty memory address pass the BIST, then at operation 595, the CIM macro is considered normal. Otherwise, if at least one bit fails, the CIM macro is considered faulty at operation 600.

Figure 8:
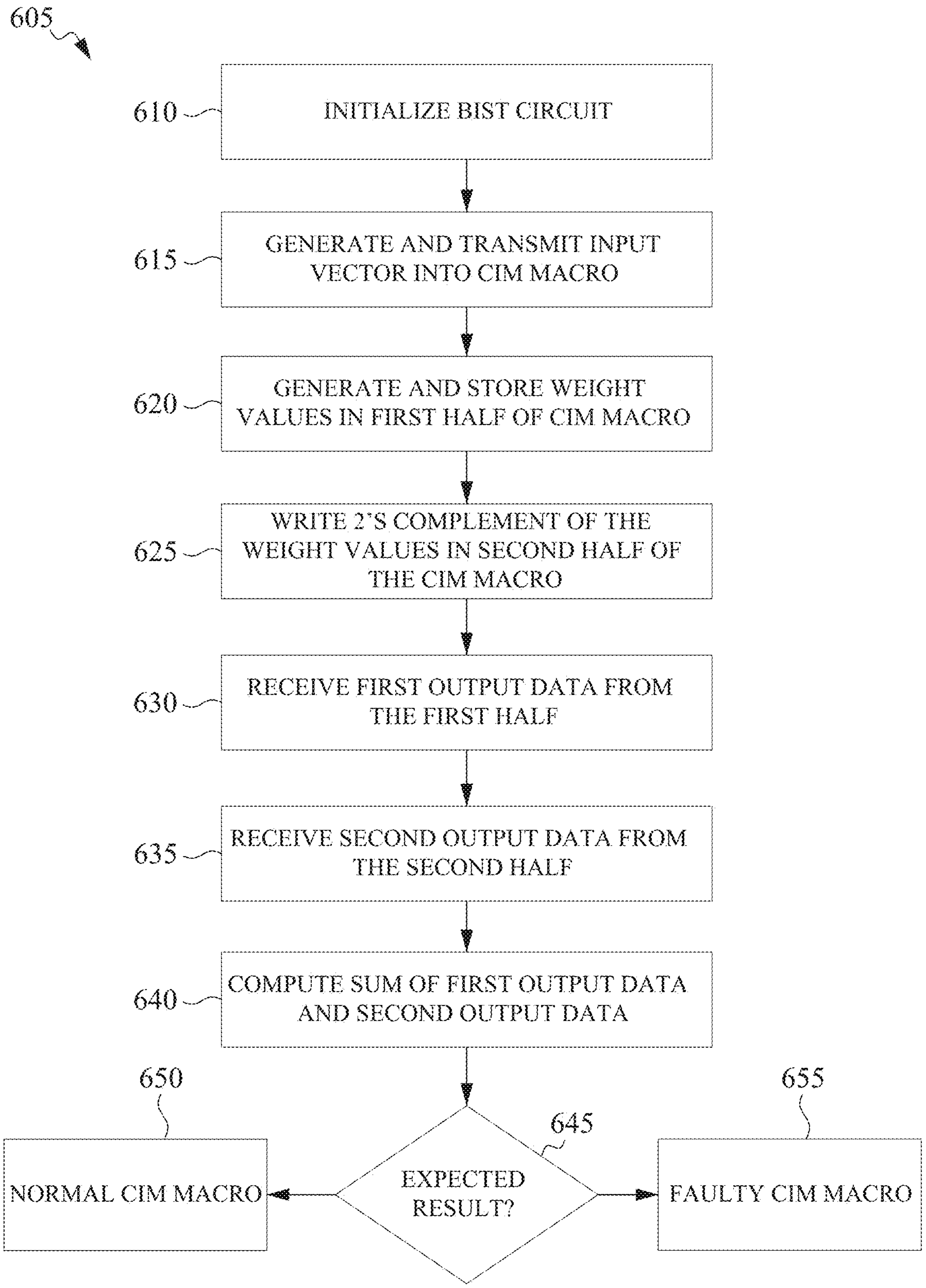
FIG. 8 is an example flowchart outlining operations of a process performed by the BIST circuit of FIG. 2 for implementing a fault free CIM result BIST methodology on the CIM macro, in accordance with some embodiments of the present disclosure.

Turning now to FIG. 8, an example flowchart outlining operations of a process 605 is shown, in accordance with some embodiments of the present disclosure. The process 605 may be used to implement a fault free CIM result BIST methodology by the BIST circuit 140. Specifically, in some embodiments and as discussed above, the same input vector may be applied to the first half 340 of the memory address range 335 and to the second half 345 of the memory address range, and the weight values in the second half may be 2's complement of the weight values in the first half. In such cases, the value of the output data of the MAC operation from the first half 340 may be the same as the value of the output data of the MAC operation from the second half 345, with the only difference being that the value of the output data from the second half may be a 2's complement of the value of the output data from the first half. In other words, the output data from the second half 345 may be a negative value and the output data from the first half 340 may be a positive value, but the two values are the same. Thus, if a sum of the output data from the first half 340 and the second half 345 is zero, it may indicate that each half of the CIM macro 155 is operating normally.

Therefore, at operation 610, the BIST circuit 140 is initialized by writing configuration values in the configuration register 265. The configuration values may include the data pattern to be generated for each cycle, a number of cycles, an expected signature value for each cycle, an initial weight register value for each cycle, memory addresses, and any other input that may be needed or considered desirable to have in implementing the process 605. At operation 615, the data generator 160 generates an input vector and transmits that input vector into the CIM macro 155, as discussed above in FIG. 4. In some embodiments, the same input vector may be used in each cycle. In other embodiments, at least some of the cycles may have a different input vector.

At operation 620, the weight generator 200 generates and stores weight values in the first half 340, as discussed above in FIG. 5. At operation 625, the weight generator generates and stores 2's complement of the weight values in the second half 345, as also discussed above. At operation 630, the BIST circuit 140 receives a first output data of the MAC operation from the first half 340 and at operation 635, the BIST circuit receives a second output data of the MAC operation from the second half 345. At operation 640, the BIST FSM 170 computes a sum of the first output data and the second output data. At operation 645, the BIST FSM 170 determines if sum is zero. If the sum is zero, then the BIST FSM 170 infers that the CIM macro 155 is normal at operation 650. Otherwise, the BIST FSM 170 determines that the CIM macro 155 is faulty at operation 655.

In some embodiments, the process 605 may be repeated in multiple cycles similar to the processes of FIGS. 4, 6, and 7. In some embodiments, the weight value of one or more memory addresses may be changed in the first half 340 such that the sum of the first output data and the second output data is not zero, but an expected value. For example, changing the weight value in one memory address of the first half 340 by X may result in the sum value being X when the sum between the first output data and the second output data is computed. Thus, making the weight value of one memory address different may produce predictable output data.

Thus, the present disclosure provides an easy, effective, and accurate method for performing BIST on a CIM macro. The BIST methodologies of the present disclosure may be used without needing to modify an existing CIM macro. The BIST methodologies disclosed herein provide a high-test coverage solution by using deterministic signed weights, random or deterministic input vectors, signed or unsigned values, and using the MAC operations to test the CIM macro without needing any specialized simulations. The BIST methodologies may be used to test the CIM macro over a wide range of input vectors and weight values. The BIST methodologies of the present disclosure are highly configurable, provide easier fault diagnostics, and provide deterministic results that lead to better resolution between normal and faulty CIM macros. The BIST methodologies of the present disclosure also provide high test coverage at high speed and short test time. For example, tests that the inventors conducted using 8 deterministic weights and 1000 pseudorandom input vectors resulted in about 99% test coverage of the CIM macro in about 15 microseconds at 1 Giga Hertz.

In accordance with some aspects of the present disclosure, a method is disclosed. The method includes generating, by a built-in self-test circuit, a plurality of input vectors for transmission to a memory macro for testing the memory macro. One input vector of the plurality of input vectors is transmitted to the memory macro in each of a plurality of cycles. Each of the plurality of input vectors is associated with a bit width. Generating the one input vector includes generating a partial input vector of half the bit width and transmitting the partial input vector to each of a first half of the memory macro and to a second half of the memory macro. The method also includes receiving, by the built-in self-test circuit, in each of the plurality of cycles, an output data from the memory macro. The output data is generated by the memory macro in response to processing the partial input vector. The method further includes comparing, by the built-in self-test circuit, the output data in each of the plurality of cycles with a signature value and determining, by the built-in self-test circuit, whether the memory macro is normal or faulty based upon the comparison.

In accordance with some other aspects of the present disclosure, another method is disclosed. The method includes generating, by a built-in self-test circuit, an input vector for transmission to a memory macro for testing the memory macro in a plurality of cycles, generating, by the built-in self-test circuit and in each of the plurality of cycles, a plurality of weights for writing to a first half of the memory macro and writing a 2's complement of the plurality of weights to a second half of the memory macro, and receiving, by the built-in self-test circuit, in each of the plurality of cycles, an output data from the memory macro. The output data of each of the plurality of cycles is generated by the memory macro in response to performing a multiply-and-accumulate operation between the input vector and the plurality of weights and the input vector and the 2's complement of the plurality of weights. The method also includes comparing, by the built-in self-test circuit, the output data in each of the plurality of cycles with a signature value associated with a respective one of the plurality of cycles and determining, by the built-in self-test circuit, whether the memory macro is normal or faulty based upon the comparison.

In accordance with yet other aspects of the present disclosure, a built-in self-test circuit is disclosed. The built-in self-test circuit includes a memory having computer-readable instructions stored thereon and a processor that executes the computer-readable instructions to generate and transmit an input vector to a memory macro for testing the memory macro. The input vector includes a partial input vector of half a bit width designated for the input vector, and the partial input vector is transmitted to each of a first half of the memory macro and a second half of the memory macro. The processor further executes the computer-readable instructions to generate and transmit a plurality of weights to the first half of the memory macro and a 2's complement of the plurality of weights to the second half of the memory macro and receive first output data from the first half of the memory macro. The first output data is generated by the memory macro in response to performing a first multiply-and-accumulate operation between the partial input vector and the plurality of weights. The processor further executes the computer-readable instructions to receive second output data from the second half of the memory macro. The second output data is generated by the memory macro in response to performing a second multiply-and-accumulate operation between the partial input vector and the 2's complement of the plurality of weights. The processor additionally executes the computer-readable instructions to compute a sum of the first output data and the second output data and determine that the memory macro is normal based upon the sum being a predetermined value.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A built-in self-test circuit comprising:
- a memory having computer-readable instructions stored thereon; and
- a processor that executes the computer-readable instructions to:
  - generate and transmit a plurality of input vectors to a memory macro, wherein each of the plurality of input vectors is associated with a bit width, by:
    - generating a partial input vector of half the bit width; and
    - transmitting the partial input vector to each of a first half of the memory macro and to a second half of the memory macro;
  - receive an output data generated by the memory macro in response to processing the partial input vector;
  - compare the output data with a signature value; and
  - determine whether the memory macro is normal or faulty based on a comparison.

2. The circuit of claim 1, wherein the memory macro is a compute in memory macro.

3. The circuit of claim 1, wherein the processor further executes computer-readable instructions to write a plurality of weights in the first half of the memory macro and a 2's complement of the plurality of weights in the second half of the memory macro.

4. The circuit of claim 3, wherein the processor further executes computer-readable instructions to perform a multiply-and-accumulate operation between the plurality of weights and the partial input vector, and between the 2's complement of the plurality of weights and the partial input vector.

5. The circuit of claim 1, wherein the processor further executes computer-readable instructions to determine that the memory macro is normal based on the output data matching the signature value in each of a plurality of cycles.

6. The circuit of claim 1, wherein the processor further executes computer-readable instructions to determine that the memory macro is faulty based on the output data not matching the signature value in at least one of a plurality of cycles.

7. The circuit of claim 1, wherein the processor further executes computer-readable instructions to write a plurality of weight values in each of the first half of the memory macro and the second half of the memory macro, and wherein all but one of the plurality of weight values is zero.

8. The circuit of claim 1, wherein the plurality of input vectors comprises a different input vector in each of a plurality of cycles, and wherein each of the different input vector is associated with a different signature value for comparison with the output data.

9. A built-in self-test circuit comprising:
- a memory having computer-readable instructions stored thereon; and
- a processor that executes the computer-readable instructions to:
  - generate and transmit an input vector to a memory macro;
  - generate a plurality of weights for writing to a first half of the memory macro and writing a 2's complement of the plurality of weights to a second half of the memory macro;
  - receive an output data generated by the memory macro in response to performing a multiply-and-accumulate operation between the input vector and the plurality of weights and the input vector and the 2's complement of the plurality of weights;
  - compare the output data with a signature value; and
  - determine whether the memory macro is normal or faulty based upon a comparison.

10. The circuit of claim 9, wherein the input vector is random or pseudorandom.

11. The circuit of claim 9, wherein the input vector is deterministic.

12. The circuit of claim 9, wherein the input vector that is transmitted to the memory macro in each of a plurality of cycles is identical.

13. The circuit of claim 9, wherein the input vector that is transmitted to the memory macro in at least some of a plurality of cycles is different from the input vector that is transmitted to the memory macro in other ones of the plurality of cycles.

14. The circuit of claim 9, wherein the processor further executes computer-readable instructions to determine that the memory macro is normal based on the output data matching the signature value in each of a plurality of cycles.

15. The circuit of claim 9, wherein the processor further executes computer-readable instructions to determine that the memory macro is faulty based on the output data not matching the signature value in at least one of a plurality of cycles.

16. The circuit of claim 9, wherein the processor further executes computer-readable instructions to generate the plurality of weights by:
- receiving an initial weight register value;
- receiving an increment value;
- initializing an active weight register value with the initial weight register value to be written in a first memory address of the first half of the memory macro; and
- incrementing the active weight register value as a function of a previous active weight register value and the increment value to be written into each next memory address of the first half of the memory macro.

17. A method comprising:
- generating, by a built-in self-test circuit, an input vector for transmission to a memory macro for testing the memory macro, the input vector comprising a partial input vector of half a bit width designated for the input vector;

transmitting the partial input vector to each of a first half of the memory macro and a second half of the memory macro;

generating a plurality of weights for transmission to the first half of the memory macro and a 2's complement of the plurality of weights for transmission to the second half of the memory macro;

receiving first output data generated by the memory macro in response to performing a first multiply-and-accumulate operation between the partial input vector and the plurality of weights;

receiving second output data generated by the memory macro in response to performing a second multiply-and-accumulate operation between the partial input vector and the 2's complement of the plurality of weights; and computing a sum of the first output data and the second output data; and determining that the memory macro is normal based upon the sum being a predetermined value.

18. The method of claim 17, wherein the predetermined value is zero.

19. The method of claim 17, further comprising modifying one of the plurality of weight values in the first half of the memory macro, wherein the predetermined value corresponds to the modified one of the plurality of weight values.

20. The method of claim 17. wherein the input vector is random, pseudo random, or deterministic.

* * * * *